(12) United States Patent
Adkisson et al.

(10) Patent No.: US 7,655,966 B2
(45) Date of Patent: Feb. 2, 2010

(54) HIGH EFFICIENCY CMOS IMAGE SENSOR PIXEL EMPLOYING DYNAMIC VOLTAGE SUPPLY

(75) Inventors: James W. Adkisson, Jericho, VT (US); John J. Ellis-Monaghan, Grand Isle, VT (US); Mark D. Jaffe, Shelburne, VT (US); Charles F. Musante, South Burlington, VT (US); Richard J. Rassel, Essex JcT, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/050,967

(22) Filed: Mar. 19, 2008

(65) Prior Publication Data

US 2009/0236644 A1    Sep. 24, 2009

(51) Int. Cl.
*H04N 3/14* (2006.01)
(52) U.S. Cl. .............................. 257/292; 257/E27.132; 257/291; 348/308; 348/310
(58) Field of Classification Search .................. 257/59, 257/258, 291, 292, 443
See application file for complete search history.

(56) References Cited

U.S. PATENT DOCUMENTS

| 6,493,030 | B1 | 12/2002 | Kozlowski |
| 7,253,461 | B2 | 8/2007 | Yang et al. |
| 2007/0013798 | A1 | 1/2007 | Ahn et al. |
| 2007/0132869 | A1* | 6/2007 | Genilloud et al. ........... 348/308 |

FOREIGN PATENT DOCUMENTS

WO   WO 2006/130443   12/2006

* cited by examiner

*Primary Examiner*—Victor A Mandala
*Assistant Examiner*—Whitney Moore
(74) *Attorney, Agent, or Firm*—Scully, Scott, Murphy & Presser, P.C.; Anthony J. Canale

(57) ABSTRACT

A global shutter compatible pixel circuit comprising a reset gate (RG) transistor is provided in which a dynamic voltage is applied to the drain of the reset gate transistor in order to reduce a floating diffusion (FD) leakage therethrough during signal hold time. The drain voltage of the reset gate transistor is held at a lower voltage than a circuit supply voltage to minimize the off-state leakage through the RG transistor, thus reducing the change in the voltage at the floating diffusion during the signal hold time. In addition, a design structure for such a circuit providing a dynamic voltage to the drain of a reset gate of a pixel circuit is also provided.

14 Claims, 10 Drawing Sheets

HIGH EFFICIENCY CMOS IMAGE SENSOR PIXEL EMPLOYING DYNAMIC VOLTAGE SUPPLY

FIELD OF THE INVENTION

The present invention relates to semiconductor circuits and semiconductor circuit design, and more particularly to semiconductor circuits including a high efficiency complementary metal oxide semiconductor (CMOS) sensor pixel employing a dynamic voltage supply, and a design structure for the same.

BACKGROUND OF THE INVENTION

An image sensor converts a visual image to digital data that may be represented by a picture. The image sensor comprises an array of pixels, which are unit devices for the conversion of the visual image into digital data. Digital cameras and optical imaging devices employ an image sensor. Image sensors include charge-coupled devices (CCDs) or complementary metal oxide semiconductor (CMOS) sensors.

While CMOS image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

For typical CMOS image sensors, the images are captured employing a "rolling shutter method." In the rolling shutter method, the imaged is captured on a row-by-row basis within a pixel array, i.e., the image is captured contemporaneously for all pixels in a row, but the capture of the image is not contemporaneous between adjacent rows. Thus, the precise time of the image capture is the same only within a row, and is different from row to row.

For each row, the image is captured in its light conversion unit. Charges generated from the light conversion unit are then transferred to a floating diffusion node. The voltage of the floating diffusion node is then read out of each pixel in the same row to column sample circuits before moving on to the next row. This process is repeated until the image is captured by the pixels in all the rows, i.e., by the entire array of the pixels. The data is then read out sequentially or in some other sequence. The resulting image is one where the each row captured actually represents the subject at a different time. Thus, for highly dynamic subjects (such as objects moving at a high rate of speed), the rolling shutter methodology can create image artifacts.

To solve this image artifact issue of capturing high speed objects, a global shutter method may be employed. The global shutter method employs a global shutter operation, in which the image for the whole frame is captured in the light conversion units of the pixels at the exact same time for all the rows and columns. The signal in each light conversion unit is then transferred to a corresponding floating diffusion node. The voltage at the floating diffusion nodes is read out of the imager array on a row-by-row basis. The global shutter method enables image capture of high speed subjects without image artifacts, but introduces a concern with the global shutter efficiency of the pixel since the integrity of the signal may be compromised by any charge leakage from the floating diffusion node between the time of the image capture and the time of the reading of the imager array.

Specifically, in the rolling shutter method, the image signal is held onto the floating diffusion node (FD) for a significantly shorter time than the actual time of exposure in the light conversion unit, e.g., a photodiode. Thus the contribution of the generation rate of the FD is orders of magnitude smaller than the generation rate during the integration time in the light conversion structure, e.g., the photodiode. And this hold time on the floating diffusion is constant for all pixels in the imager array, making correction for any of its contribution simple with standard correlated double sample CDS techniques.

In contrast, the image signal is held onto the FD for varying amounts of time in the global shutter method. For example, the signal from the first row may have the least wait time which corresponds to the time needed to read out a single row, while the signal from the last row has the greatest wait time which almost corresponds to the full frame read-out time, during which the charge on the floating diffusion may be degraded due to charge leakage or charge generation. Any charge generations or charge leakage that occurs on the floating diffusion node during the wait time can have a significant impact to the quality of the signal that is read out of the imager.

A metric of the efficiency in preserving the initial charge in the pixel is "global shutter efficiency," which is the ratio of a signal that is actually read out of the pixel to the signal that would have been read out immediately after the signal was captured by the pixel. Ideally, the signal read out should be exactly the same as the signal captured, i.e., the global shutter efficiency should be 1.0 in an ideal CMOS image sensor. In practice, this is not the case due to the charge leakage and/or charge generation, and the picture quality is correspondingly degraded.

In order to improve on the global shutter efficiency, it is necessary to reduce any change to the signal being held in the floating diffusion in the form of electrical charge. In view of the above, there is a need for semiconductor devices and circuits providing reduced changes in the signal stored in a floating diffusion.

Further, there exists a need for design structure for enabling the design and manufacture of such semiconductor devices and circuits.

SUMMARY OF THE INVENTION

To address the needs described above, the present invention provides a global shutter compatible pixel circuit comprising a reset gate (RG) transistor. A dynamic voltage is applied to the drain of the reset gate transistor in order to reduce a floating diffusion (FD) leakage therethrough during signal hold time.

While a high supply voltage is required on the drain of the reset gate transistor during the resetting and initializing of the pixel, such high voltage on the reset gate drain is not needed during the signal hold time. According to the present invention, the drain voltage of the reset gate transistor is held at an alternate potential to minimize the off-state leakage through the RG transistor, thus reducing the change in the voltage at the floating diffusion during the signal hold time.

In addition, a design structure for such a circuit providing a dynamic voltage to the drain of a reset gate of a pixel circuit is also provided.

According to an aspect of the present invention, a semiconductor circuit for an image sensor pixel is provided. The semiconductor circuit comprises:

a photosensitive diode;

a first transistor, which is a global shutter transistor, including a first transistor source, which is a global shutter transistor source, directly connected to the photosensitive diode;

a second transistor, which is a transfer gate transistor, including a second transistor source, which is a transfer gate transistor source, directly connected to the photodiode and a second transistor drain, which is a transfer gate transistor drain, constituting a floating diffusion node; and a third transistor, which is a reset gate transistor, including a third transistor source, which is a reset gate transistor source, directly connected to the floating diffusion node and a third transistor drain, which is a reset gate transistor drain, connected to a switchable voltage supply circuit configured to provide at least two different voltages to the third transistor drain.

In one embodiment, the at least two different voltages include a system power supply voltage and an alternate voltage lower than the system power supply voltage.

In another embodiment, the semiconductor circuit further comprises:

a fourth transistor, which is a source follower transistor, including a fourth transistor source, which is a source follower transistor source, and a fourth transistor gate, which is a source follower transistor gate, wherein the fourth transistor gate is directly connected to the floating diffusion node; and a fifth transistor, which is a row select transistor, including a fifth transistor drain, which is a row select transistor drain, and a fifth transistor source, which is a row select transistor source, wherein the fifth transistor drain is directly connected to the fourth transistor source and the fifth transistor source is configured to provide an output signal of the image sensor pixel.

In even another embodiment, the fourth transistor includes a fourth transistor drain that is directly connected to the switchable voltage supply circuit.

In yet another embodiment, the fourth transistor includes a fourth transistor drain that is directly connected to the system power supply voltage and is disconnected from the switchable voltage supply circuit.

In still another embodiment, the first transistor further includes a first transistor drain, which is a global shutter transistor drain, directly connected to the system power supply voltage and a first transistor gate, which is a global shutter transistor gate, disconnected from the system power supply voltage.

In still yet another embodiment, the first transistor further includes a first transistor drain, which is a global shutter transistor drain, and a first transistor gate, which is a global shutter transistor gate, wherein the first transistor drain and the first transistor gate are directly connected and configured to receive a common control signal.

According to another aspect of the present invention another semiconductor circuit for an image sensor pixel is provided. The semiconductor circuit comprises:

a photosensitive diode;

a first transistor, which is a global shutter transistor, including a first transistor source, which is a global shutter transistor source, directly connected to the photosensitive diode;

a second transistor, which is a transfer gate transistor, including a second transistor source, which is a transfer gate transistor source, directly connected to the photodiode and a second transistor drain, which is a transfer gate transistor drain, constituting a floating diffusion node; and a third transistor, which is a reset gate transistor, including a third transistor source, which is a reset gate transistor source, directly connected to the floating diffusion node and a third transistor drain, which is a reset gate transistor drain, connected to a control signal configured to be set at two different voltages and directly applied to at least one transistor of the image sensor pixel.

In one embodiment, the control signal is directly connected to a gate of the third transistor, which is the reset gate transistor.

In another embodiment, the first transistor further includes a first transistor drain, which is a global shutter transistor drain, and a first transistor gate, which is a global shutter transistor gate, wherein the first transistor drain and the first transistor gate are directly connected and configured to receive a common global shutter control signal that is electrically isolated from the control signal.

In even another embodiment, the semiconductor circuit further comprises:

a fourth transistor, which is a source follower transistor, including a fourth transistor source, which is a source follower transistor source, and a fourth transistor gate, which is a source follower transistor gate, wherein the fourth transistor gate is directly connected to the floating diffusion node; and a fifth transistor, which is a row select transistor, including a fifth transistor drain, which is a row select transistor drain, and a fifth transistor source, which is a row select transistor source, wherein the row select transistor drain is directly connected to the fourth transistor source and the fifth transistor source is configured to provide an output signal of the image sensor pixel.

In yet another embodiment, the fourth transistor further comprises a fourth transistor drain directly connected to a system power supply voltage.

In still another embodiment, the fourth transistor further comprises a fourth transistor drain and the fifth transistor further comprises a fifth transistor gate, and wherein the fourth transistor drain is directly connected to the fifth transistor gate.

In still yet another embodiment, the control signal is directly connected to the fifth transistor gate.

According to yet another aspect of the present invention, a method of operating a semiconductor circuit of an array of image sensors is provided. The method employs the semiconductor circuits of the present invention as described above. The method comprises:

providing an array of image sensor pixels, each of the image sensor pixels including:
a photosensitive diode;
a global control transistor including a global control transistor source directly connected to the photosensitive diode;
a transfer gate transistor including a transfer gate transistor source directly connected to the photodiode and a floating drain constituting a floating diffusion node; and
a reset gate transistor including a reset gate transistor source directly connected to the floating diffusion node;

exposing an entirety of the array simultaneously, while applying a first voltage to each drain of reset gate transistors in the entirety of the array;

applying a second voltage to each drain of the reset gate transistors of the entirety of the array after the exposing of the entirety of the array, wherein the second voltage is less than the first voltage; and transferring data from the array of image sensors row by row, wherein the hold time between the exposing of the entirety of the array and the transferring is different from row to row.

Preferably, the second voltage provides less leakage of charge per time of a floating diffusion node than the first voltage.

In one embodiment, a switching between the first voltage and the second voltage is accommodated by a switchable voltage supply circuit connected to a system power supply voltage and an alternate voltage lower than the system power supply voltage.

In another embodiment, the first voltage and the second voltage is provided by a control signal configured to be set at two different voltages and directly applied to at least one transistor of the image sensor pixel.

In yet another embodiment, the at least one transistor includes a reset gate transistor within the image sensor pixel, and wherein the control signal is directly connected to a gate of the reset gate transistor.

In still another embodiment, the image sensor pixel comprises:

a source follower transistor including a source follower transistor source and a source follower transistor gate, wherein the source follower transistor gate is directly connected to the floating diffusion node; and a row select transistor including a row select transistor drain and a row select transistor source, wherein the row select transistor drain is directly connected to the source follower transistor source and the row select transistor source is configured to provide an output signal of the image sensor pixel.

In still yet another embodiment, the at least one transistor includes the row select transistor, and the control signal is directly connected to a gate of the row select transistor.

According to even another aspect of the present invention, another method of operating a semiconductor circuit of an array of image sensors is provided. The method employs the semiconductor circuits of the present invention as described above. The method comprises:

exposing an entirety of the array simultaneously;

applying a first voltage to each drain of reset gate transistors in one row of the array, while applying a second voltage to each drain of reset gate transistors in other rows of the array, wherein the first voltage is different from the second voltage, wherein the second voltage provides less leakage of charge per time of a floating diffusion node than the first voltage; and transferring data from the array of image sensors row by row, wherein a hold time between the exposing of the entirety of the array and the transferring is different from row to row.

In still another aspect of the present invention, a design structure embodied in a machine readable medium for designing, manufacturing, or testing a design is provided. The design structure includes data representing the semiconductor circuits of the present invention as described above.

For example, the design structure may comprise:

a first data representing a photosensitive diode;

a second data representing a first transistor, which is a global shutter transistor, including a first transistor source, which is a global shutter transistor source, directly connected to the photosensitive diode;

a third data representing a second transistor, which is a transfer gate transistor, including a second transistor source, which is a transfer gate transistor source, directly connected to the photodiode and a second transistor drain, which is a transfer gate transistor drain, constituting a floating diffusion node; and a fourth data representing a third transistor, which is a reset gate transistor, including a third transistor source, which is a reset gate transistor source, directly connected to the floating diffusion node and a third transistor drain, which is a reset gate transistor drain, connected to circuit configured to dynamically apply a first voltage and a second voltage, wherein the first voltage is different from the second voltage, and wherein the second voltage provides less leakage of charge per time from the floating diffusion node than the first voltage.

In one embodiment, the design structure comprises a netlist.

In another embodiment, the design structure resides on storage medium as a data format used for exchange of layout data of integrated circuits.

In even another embodiment, the design structure further comprises a fifth data representing a switchable voltage supply circuit configured to dynamically provide the first voltage or the second voltage to the third transistor drain, and the first voltage is a system power supply voltage.

In yet another embodiment, the first voltage and the second voltage are provided by a control signal configured to be set at two different voltages and directly applied to a data representing at least one transistor.

In still another embodiment, the design structure further comprises:

a sixth data representing a fourth transistor, which is a source follower transistor, including a fourth transistor source, which is a source follower transistor source, and a fourth transistor gate, which is a source follower transistor gate, wherein the fourth transistor gate is directly connected to the floating diffusion node; and a seventh data representing a fifth transistor, which is a row select transistor, including a fifth transistor drain, which is a row select transistor drain, and a fifth transistor source, which is a row select transistor source, wherein the fifth transistor drain is directly connected to the fourth transistor source and the fifth transistor source is configured to provide an output signal of an image sensor pixel.

The design structure may further comprise other data representing other elements of the semiconductor circuit of the present invention.

DETAILED DESCRIPTION OF THE INVENTION

As stated above, the present invention relates to semiconductor circuits including a high efficiency complementary metal oxide semiconductor (CMOS) sensor pixel employing a dynamic voltage supply, and a design structure for the same, which are now described in detail with accompanying figures. It is noted that like and corresponding elements are referred to by like names and/or labels across the various embodiment of the present invention.

Figure 1:
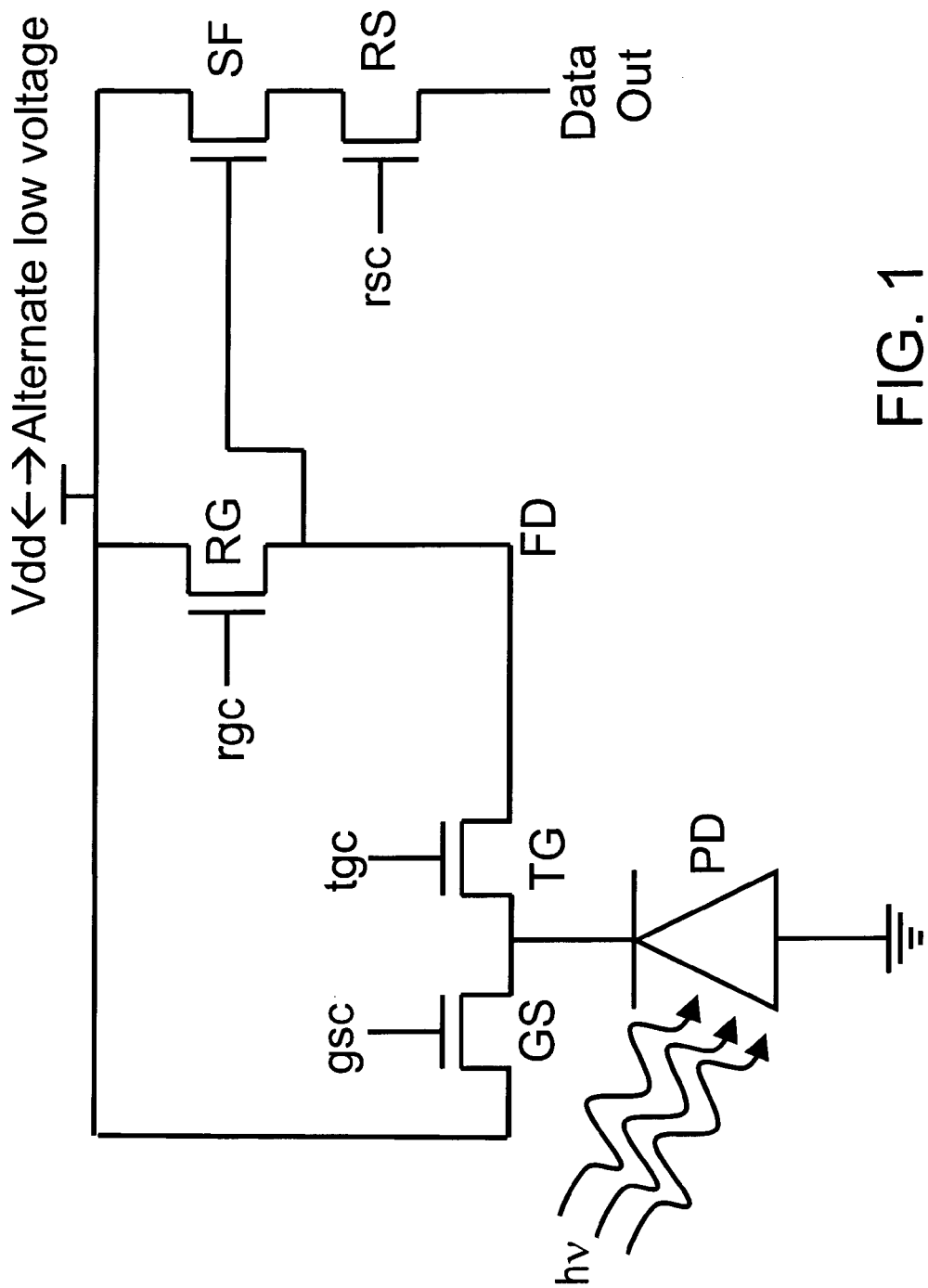
FIGS. 1-9 show semiconductor circuits according to first through ninth embodiments of the present invention, respectively.

Referring to FIG. 1, a first exemplary semiconductor circuit comprising an image sensor pixel is shown according to a first embodiment of the present invention. The first exemplary semiconductor circuit comprises a photosensitive diode PD, a global shutter transistor GS, a transfer gate transistor TG, a reset gate transistor RG, a source follower transistor SF, and a row select transistor RS. One end of the photosensitive diode PD is grounded, while the other end of the photosensitive diode PD is directly connected to the source of the global shutter transistor GS, which is herein referred to as a global shutter transistor source, and to the source of the transfer gate transistor TG, which is herein referred to as a transfer gate transistor source. The drain of the transfer gate transistor TG, which is herein referred to as a transfer gate transistor drain, constitutes a floating diffusion node FD, which is electrically floating while the transfer gate transistor TG and the reset gate transistor are turned off. The floating diffusion node FD is directly connected to the source of the reset gate transistor RG, which is herein referred to a reset gate transistor source, and to the gate of the source follower transistor SF, which is herein referred to the source follower transistor gate. While the floating diffusion node FD is typically implemented as the drain of the transfer gate transistor TG, the floating diffusion node FD may alternately implemented as the source of the reset gate transistor in a physical device.

The source of the source follower transistor SF is directly connected to the drain of the row select transistor RS, which is herein referred to as a row select transistor drain. The source of the row select transistor RS, which is herein referred to as a row select transistor source, is a "data out" node, or the node at which the output of the image sensor pixel.

According to the first embodiment, the drain of the reset gate transistor RG, which is herein referred to as a reset gate transistor drain, is directly connected to a switchable voltage supply circuit configured to provide at least two different voltages. Further, the drain of the global shutter transistor GS, which is herein referred to as a global shutter transistor drain, and the drain of the source follower transistor SF, which is herein referred to as a source follower transistor drain, are also directly connected to the switchable voltage supply circuit. The at least two different voltages may include a system power supply voltage Vdd and an alternate voltage lower than the system power supply voltage Vdd. The system power supply voltage Vdd herein refers to the power supply voltage employed for operation of general semiconductor circuit including the image sensor pixel in a normal operation mode.

While the description of the present invention employs a power supply system in which electrical ground and a positive power supply voltage for the system power supply voltage Vdd are employed, variations of the present invention in which a negative power supply voltage and/or a power supply that is offset from the electrical ground by a constant offset are also explicitly contemplated herein. In general, the difference between the alternate low voltage and the voltage applied to the node of the photosensitive diode PD that is not connected to the transfer gate transistor TG, which is herein referred to as a ground node, and the global shutter transistor GS is less in magnitude than the difference between the system power supply voltage Vdd and the ground node. For example, the alternate low voltage may be from about 10% to 90% of the system power supply voltage Vdd, and typically from about 30% to about 70% of the system power supply voltage Vdd. It is understood that such variations in the polarity and ground level in circuit operation are applicable to all other embodiments of the present invention as applicable as well as to the first embodiment.

The first exemplary semiconductor circuit may be employed to form an array of image sensors to capture an image. Such an array of image sensors may be employed in any optical, infrared, or ultraviolet imaging device including digital cameras. Each image sensor unit is referred to as a pixel. The operation of the array of the image sensors includes an exposure sequence and a readout sequence. The exposure sequence may be performed simultaneously employing the global shutter method. The readout sequence is performed row by row, i.e., the time for performing the readout sequence varies from row to row. Thus, the hold time between the exposure sequence and the readout sequence varies from row to row.

During the exposure sequence, the switchable voltage supply circuit provides the system power supply voltage Vdd to the global shutter transistor drain, the reset gate transistor drain, and the source follower transistor drain. The amount of light impinging on the photosensitive diode PD is quantified by the amount of charge that accumulates in the floating drain node FD. All image sensor pixels in the entire array are exposed to photons that impinging thereupon at the same time for the same duration through the operation of a global shutter circuit. The photons are schematically represented by wavy arrows labeled "hv."

Initially, the global shutter control signal "gsc" turns on the global shutter transistor GS, which resets the photosensitive diode PD to a pinning voltage. The same global shutter control signal "gsc" is applied to all other global shutter transistors in an image sensor. The global shutter control signal "gsc" is then changed to turn off the global shutter transistor GS. At this step, the same global shutter control signal "gsc" is applied to all other global shutter transistors in the image sensor. All photosensitive diodes in the image sensor, including the photosensitive diode PD in FIG. 1, are exposed to impinging lights and generate charges. The electrical charges generated by the photosensitive diode PD continue to be accumulated on the node of the photosensitive diode PD tied to the global shutter transistor GS and the transfer gate transistor TG.

The reset gate RG is turned on by a reset gate control signal "rgc" so that the voltage level of the floating drain node FD is reset. The same reset gate control signal "gsc" is applied to all other reset gate transistors in the image sensor. Normally, the voltage at the floating drain node FD becomes substantially the same as the system power supply voltage Vdd. The reset gate RG is then turned on by a change in the reset gate control signal "rgc." The same reset gate control signal "gsc" is applied to all other reset gate transistors to turn off all reset gate transistors in the image sensor. Since the floating drain node FD is floating, the voltage at the floating drain node FD remains at the same voltage before the reset gate transistor RG is turned off. The transfer gate TG is turned on by a transfer gate control signal "tgc," which ends exposure of the photosensitive diode PD and integration of electrical charges in the photosensitive diode PD. The charged collected up to that point in the photosensitive diode is transferred through the transfer gate transistor TG to the floating drain node FD. The same transfer gate control signal "tgc" is applied to all other transfer gate transistors to transfer collected charges from each photosensitive diode to a corresponding floating drain node through a transfer gate transistor. The transfer gate transistor TG and all other transfer gate transistors in the image sensor are turned by a change in the transfer gate control signal "tgc."

The sequence described above may be started again at this point while the following readout sequence is performed. Alternately, the global shutter control signal "gsc" may be set to turn on all global shutter transistors to protect against blooming of photosensitive diodes during the following readout sequence.

The readout sequence is performed row by row by selecting a row to be read out sequentially from the first row to the last row. The row select transistors in each row are controlled by a common row selection signal "rsc." Thus, there may be as many independent common row selection signals as the number of rows. Once a row is selected, all row selection transistors RS in the selected row are turned on. The shift of the voltage at a floating drain node FD from the system power supply voltage Vdd is proportional to the amount of photons that the corresponding photosensitive diode PD generates, which is proportional to the amount of light impinging on the photosensitive diode PD. The voltage on the data out node of each pixel is read out in each column. The voltage level provides a first quantity related to the amount of electrical charge that the photosensitive diode PD generated.

The reset gate transistors are thereafter turned on for the selected row. This allows the readout of a second quantity, which is a background level signal for each pixel in the row. By subtracting the second quantity from the first quantity, any circuit related offset to the current measurement that generated the first quantity is compensated, i.e., any circuit specific contributions to the image data from the image sensor are eliminated.

However, there is a small amount of leakage of charge from the floating drain node FD to the substrate, through the transfer gate transistor TG, and the reset gate transistor RG since no device is perfect. In practical terms, the most significant leakage is typically the leakage through the reset gate transistor. Such a leakage alters the voltage at the floating drain node FD during the hold time between the exposure sequence and the readout sequence. The greater the leakage, the greater the shift in the voltage during the hold time, and consequently, the greater the degree of image degradation from the array of the image sensor pixels.

According to the first embodiment of the present invention, the switchable voltage supply circuit provides the alternate low voltage, which is less than the system power supply voltage, to the global shutter transistor drain, the reset gate transistor drain, and the source follower transistor drain during the hold time for each row of the array of the image sensor pixels. The reduction of voltage applied to the reset gate transistor drain has the effect of decreasing the voltage bias across the reset gate transistor source and the reset gate transistor drain, thereby reducing the leakage current through the reset gate transistor RG during the hold time. The reduction of the leakage current through the reset gate transistor RG reduces the shift of the voltage at the floating drain node FD throughout the hold time. Thus, the voltage at the floating drain node FD during the readout sequence more closely replicates the voltage at the floating drain node FD immediately after the exposure sequence, thereby enhancing the overall fidelity of the image obtained from the array of the image sensor pixels.

During the readout sequence, the switchable voltage supply circuit provides the system power supply voltage Vdd to the global shutter transistor drain, the reset gate transistor drain, and the source follower transistor drain. The row select transistor RS is turned on by providing a high voltage, which may, or may not be, substantially the same as the system power supply voltage Vdd, to the row select control signal "rsc." The current flowing out of the row select transistor RS at the "data out" node is determined by the voltage at the source follower transistor gate, which is the voltage at the floating drain node FD. Thus, the amount of the light that impinged onto the photosensitive diode PD is translated into an electrical signal at the "data out" node, which is the source of the row select transistor RS for each of the image sensor pixel in the array.

Optionally, any offset between different pixels may be compensated for by calibrating each pixel. One method of effecting such compensation is to turn on the reset gate transistor RG after measuring the electrical signal at the "data out" node. The floating drain node FD charges to the system power supply voltage. The electrical signal is measured at the "data out" node with the row select control signal "rsc" set to the high voltage. The electrical signal thus measured is the background level signal corresponding to a reset level of the floating diffusion in the corresponding pixel.

In one aspect, the method of operating a semiconductor circuit of an array of image sensors according to the first embodiment of the present invention comprises:

exposing an entirety of the array simultaneously;

providing a first voltage, such as the system power supply voltage Vdd, to each drain of reset gate transistors in one row of the array so that a readout sequence is performed for the one row, while providing a second voltage, which is the alternate low voltage, to each drain of reset gate transistors in other rows of the array as the pixels therein maintain the voltage at their floating drain nodes throughout a hold time, wherein the first voltage is different from the second voltage, and wherein the second voltage provides less leakage of charge per time of floating diffusion nodes than the first voltage; and transferring data from the array of image sensors row by row, wherein the hold time between the exposing of the entirety of the array and the transferring is different from row to row.

In another aspect, the method of operating a semiconductor circuit of an array of image sensors according to the first embodiment of the present invention comprises:

exposing an entirety of the array simultaneously, while applying a first voltage, which is the system power supply voltage Vdd, to each drain of reset gate transistors in the entirety of the array;

applying a second voltage, which is the alternate low voltage, to each drain of the reset gate transistors of the entirety of the array after the exposing of the entirety of the array, wherein the second voltage is less than the first voltage, wherein the second voltage provides less leakage of charge per time of a floating diffusion node than the first voltage; and transferring data from the array of image sensors row by row, wherein the hold time between the exposing of the entirety of the array and the transferring is different from row to row.

Figure 2:
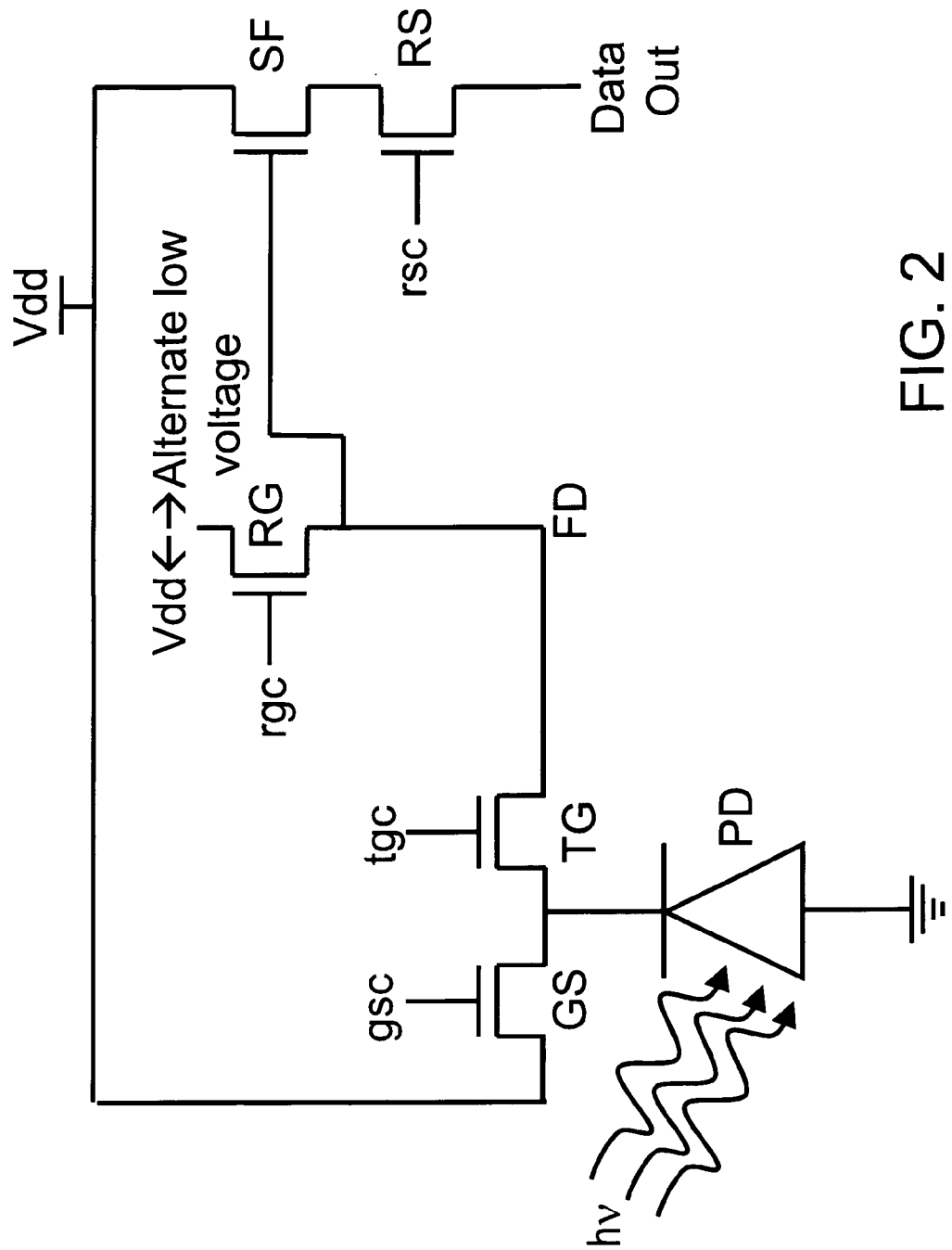

Referring to FIG. 2, a second exemplary semiconductor circuit comprising an image sensor pixel is shown according to a second embodiment of the present invention. The second exemplary semiconductor circuit comprises a photosensitive diode PD, a global shutter transistor GS, a transfer gate transistor TG, a reset gate transistor RG, a source follower transistor SF, and a row select transistor RS as the first exemplary semiconductor circuit.

According to the second embodiment, the drain of the reset gate transistor RG, which is herein referred to as a reset gate transistor drain, is directly connected to a switchable voltage supply circuit configured to provide at least two different voltages. In contrast with the first embodiment, however, the drain of the global shutter transistor GS, which is herein referred to as a global shutter transistor drain, and the drain of the source follower transistor SF, which is herein referred to as a source follower transistor drain, are directly connected to a system power supply voltage Vdd. The at least two different voltages may include the system power supply voltage Vdd and an alternate voltage lower than the system power supply voltage Vdd. The system power supply voltage Vdd herein refers to the power supply voltage employed for operation of general semiconductor circuit including the image sensor pixel in a normal operation mode.

The second exemplary semiconductor circuit may be employed to form an array of image sensors to capture an image in the same manner as the first embodiment. The exposure sequence may be performed in substantially the same manner as in the first embodiment. As in the first embodiment, the hold time between the exposure sequence and the readout sequence varies from row to row.

According to the second embodiment of the present invention, the switchable voltage supply circuit provides the alternate low voltage, which is less than the system power supply voltage Vdd, to the reset gate transistor drain during the hold time for each row of the array of the image sensor pixels. During this time, the system power supply voltage Vdd is applied to the global shutter transistor drain and the source follower transistor drain. The reduction of voltage applied to the reset gate transistor drain has the effect of decreasing the voltage bias across the reset gate transistor source and the reset gate transistor drain, thereby reducing the leakage current through the reset gate transistor RG during the hold time as well as other consequent benefits as in the first embodiment. The same readout sequence may be employed in the second embodiment as in the first embodiment.

Figure 3:
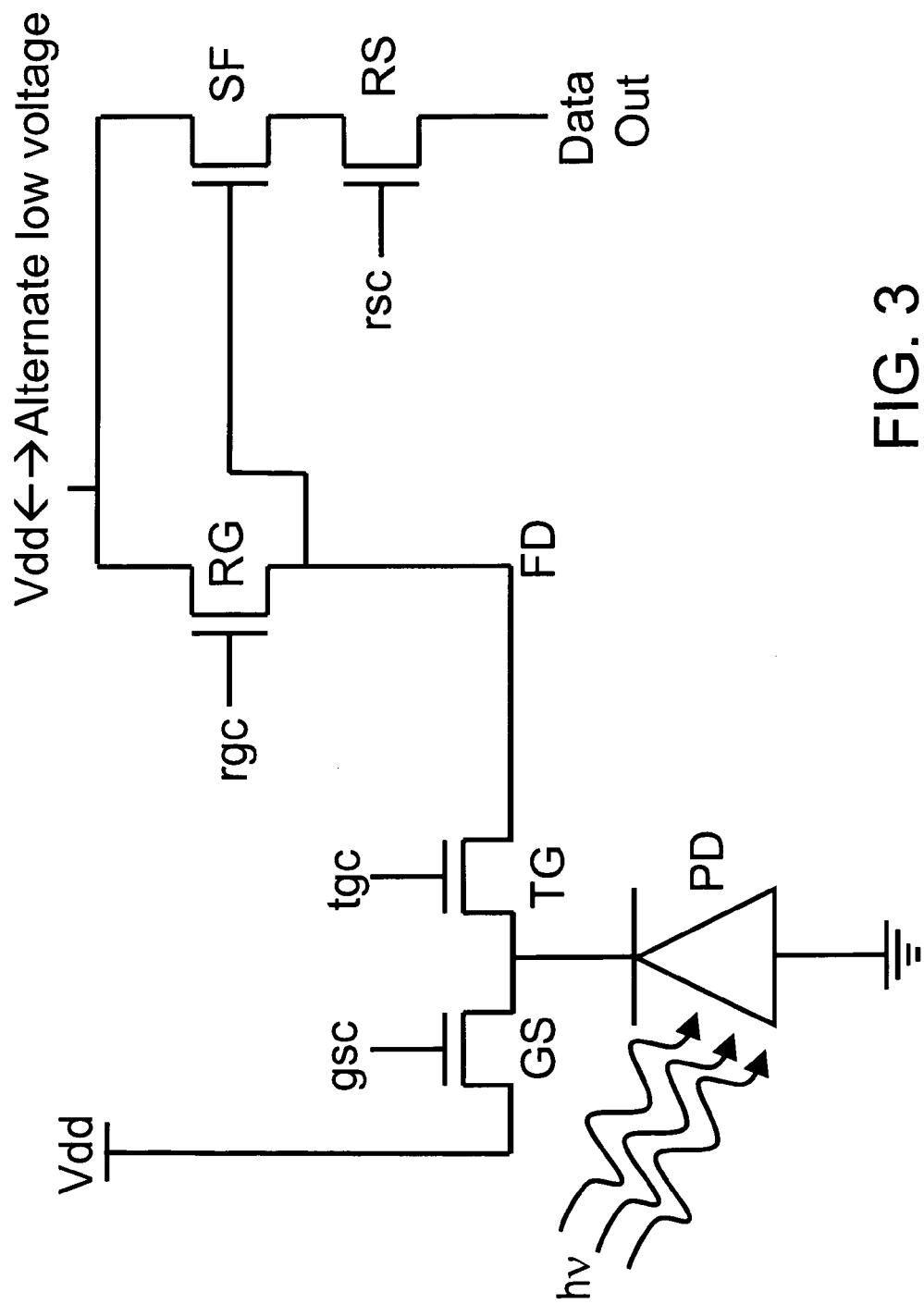

Referring to FIG. 3, a third exemplary semiconductor circuit comprising an image sensor pixel is shown according to a third embodiment of the present invention. The third exemplary semiconductor circuit comprises a photosensitive diode PD, a global shutter transistor GS, a transfer gate transistor TG, a reset gate transistor RG, a source follower transistor SF, and a row select transistor RS as the first exemplary semiconductor circuit.

According to the third embodiment, the drain of the reset gate transistor RG, which is herein referred to as a reset gate transistor drain, and the drain of the source follower transistor SF, which is herein referred to as a source follower transistor drain, are directly connected to a switchable voltage supply circuit configured to provide at least two different voltages. In contrast with the first embodiment, however, the drain of the global shutter transistor GS, which is herein referred to as a global shutter transistor drain, is directly connected to a system power supply voltage Vdd. The at least two different voltages may include the system power supply voltage Vdd and an alternate voltage lower than the system power supply voltage Vdd. The system power supply voltage Vdd herein refers to the power supply voltage employed for operation of general semiconductor circuit including the image sensor pixel in a normal operation mode.

The third exemplary semiconductor circuit may be employed to form an array of image sensors to capture an image in the same manner as the first embodiment. The exposure sequence may be performed in substantially the same manner as in the first embodiment. As in the first embodiment, the hold time between the exposure sequence and the readout sequence varies from row to row.

According to the third embodiment of the present invention, the switchable voltage supply circuit provides the alternate low voltage, which is less than the system power supply voltage Vdd, to the reset gate transistor drain and the source follower transistor drain during the hold time for each row of the array of the image sensor pixels. During this time, the system power supply voltage Vdd is applied to the global shutter transistor drain. The reduction of voltage applied to the reset gate transistor drain has the effect of decreasing the voltage bias across the reset gate transistor source and the reset gate transistor drain, thereby reducing the leakage current through the reset gate transistor RG during the hold time as well as other consequent benefits as in the first embodiment. The same readout sequence may be employed in the third embodiment as in the first embodiment.

Figure 4:
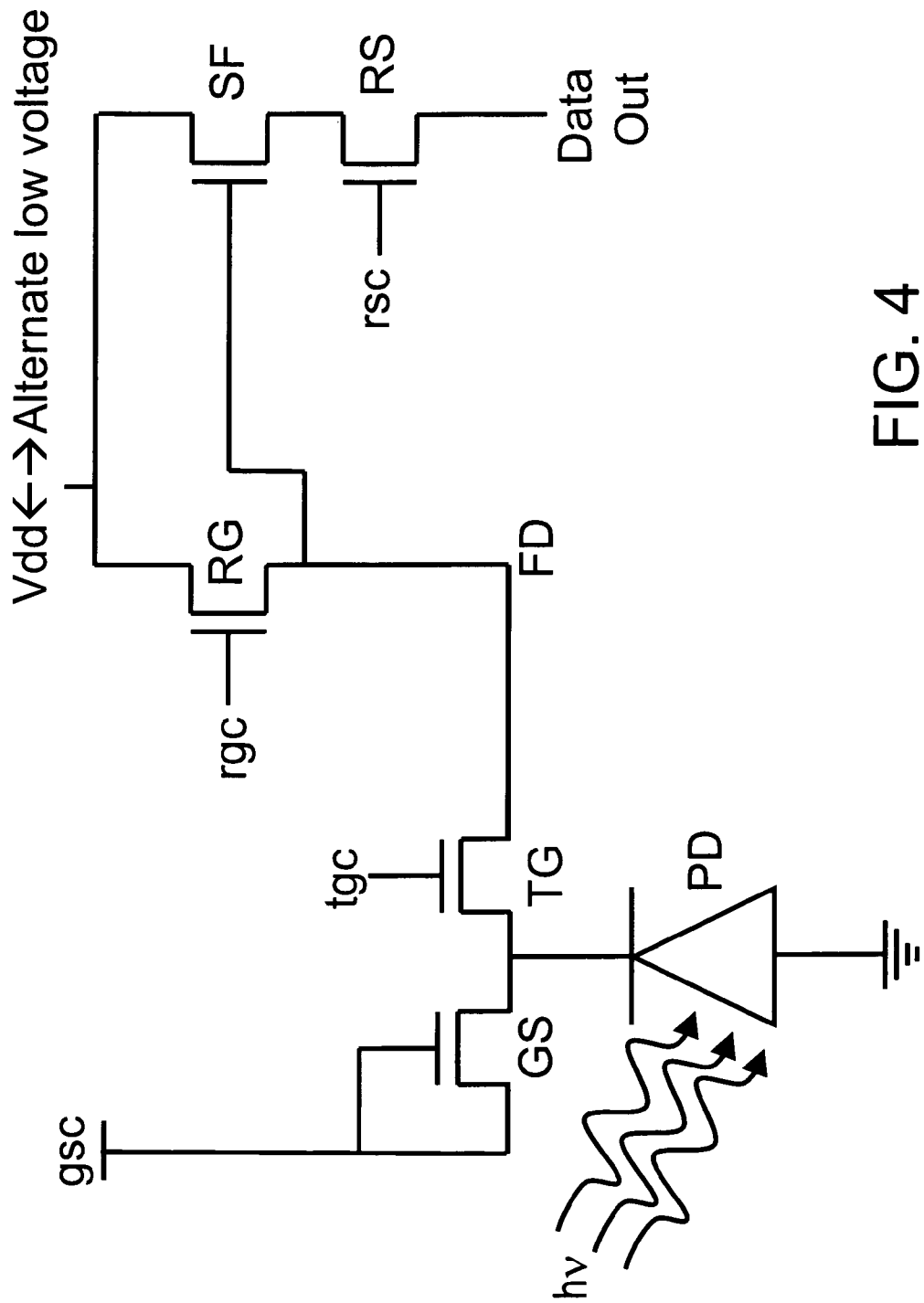

Referring to FIG. 4, a fourth exemplary semiconductor circuit comprising an image sensor pixel is shown according to a fourth embodiment of the present invention. The fourth exemplary semiconductor circuit comprises a photosensitive diode PD, a global shutter transistor GS, a transfer gate transistor TG, a reset gate transistor RG, a source follower transistor SF, and a row select transistor RS as the third exemplary semiconductor circuit.

According to the fourth embodiment, the drain of the reset gate transistor RG, which is herein referred to as a reset gate transistor drain, and the drain of the source follower transistor SF, which is herein referred to as a source follower transistor drain, are directly connected to a switchable voltage supply circuit configured to provide at least two different voltages. The at least two different voltages may include the system power supply voltage Vdd and an alternate voltage lower than the system power supply voltage Vdd. The system power supply voltage Vdd herein refers to the power supply voltage employed for operation of general semiconductor circuit including the image sensor pixel in a normal operation mode.

In contrast with the third embodiment, however, the drain of the global shutter transistor GS, which is herein referred to as a global shutter transistor drain, is directly connected to the gate of the global shutter transistor GS, which is herein referred to as a global shutter transistor gate, to which a gate shutter control signal "gsc" is applied. The gate shutter control signal is held high only during the exposure sequence during the operation of the image sensor pixel. The voltage of the gate shutter control signal "gsc" may, or may not, be substantially the same as the system power supply voltage Vdd. During the readout sequence, the gate shutter control signal "gsc" may be held low to shut off any leakage current through the global shutter transistor GS in each image sensor pixel.

The fourth exemplary semiconductor circuit may be employed to form an array of image sensors to capture an image in the same manner as the first embodiment. The exposure sequence may be performed in substantially the same manner as in the first embodiment. As in the first embodiment, the hold time between the exposure sequence and the readout sequence varies from row to row.

According to the fourth embodiment of the present invention, the switchable voltage supply circuit provides the alternate low voltage, which is less than the system power supply voltage Vdd, to the reset gate transistor drain and the source follower transistor drain during the hold time for each row of the array of the image sensor pixels. During this time, the system power supply voltage Vdd is applied to the global shutter transistor drain. The reduction of voltage applied to the reset gate transistor drain has the effect of decreasing the voltage bias across the reset gate transistor source and the reset gate transistor drain, thereby reducing the leakage current through the reset gate transistor RG during the hold time as well as other consequent benefits as in the first embodiment. The same readout sequence may be employed in the fourth embodiment as in the first embodiment.

Figure 5:
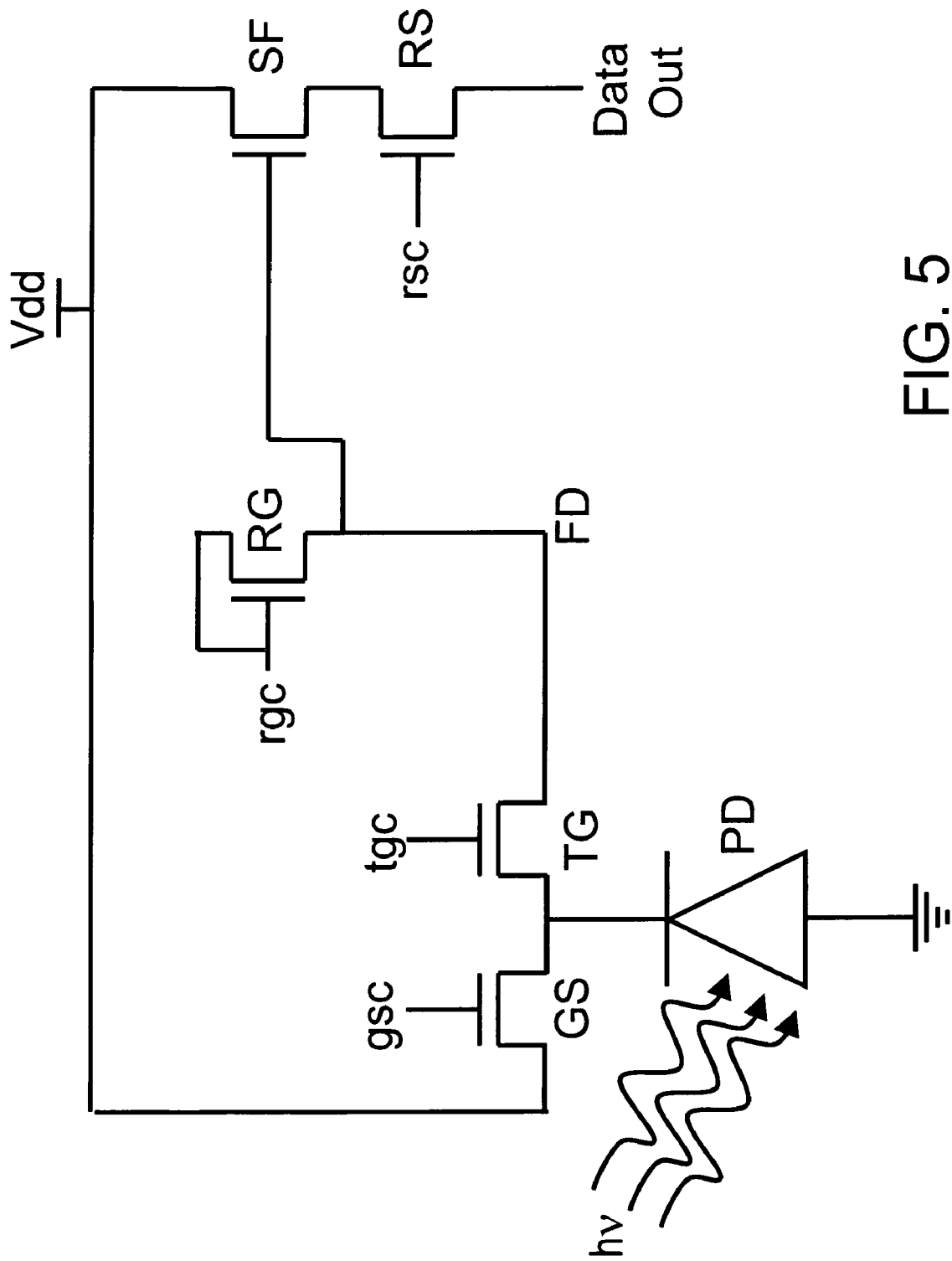

Referring to FIG. 5, a fifth exemplary semiconductor circuit comprising an image sensor pixel is shown according to a fifth embodiment of the present invention. The fifth exemplary semiconductor circuit comprises a photosensitive diode PD, a global shutter transistor GS, a transfer gate transistor TG, a reset gate transistor RG, a source follower transistor SF, and a row select transistor RS. One end of the photosensitive diode PD is grounded, while the other end of the photosensitive diode PD is directly connected to the source of the global shutter transistor GS, which is herein referred to as a global shutter transistor source, and to the source of the transfer gate transistor TG, which is herein referred to as a transfer gate transistor source. The drain of the transfer gate transistor TG, which is herein referred to as a transfer gate transistor drain, constitutes a floating diffusion node FD, which is electrically floating while the transfer gate transistor TG and the reset gate transistor are turned off. The floating diffusion node FD is directly connected to the source of the reset gate transistor RG, which is herein referred to a reset gate transistor source, and to the gate of the source follower transistor SF, which is herein referred to the source follower transistor gate. While the floating diffusion node FD is typically implemented as the drain of the transfer gate transistor TG, the floating diffusion node FD may alternately implemented as the source of the reset gate transistor in a physical device.

The source of the source follower transistor SF is directly connected to the drain of the row select transistor RS, which is herein referred to as a row select transistor drain. The source of the row select transistor RS, which is herein referred to as a row select transistor source, is a "data out" node, or the node at which the output of the image sensor pixel.

According to the fifth embodiment, the drain of the reset gate transistor RG, which is herein referred to as a reset gate transistor drain, is directly connected to the gate of the reset gate transistor RG. The drain of the global shutter transistor GS, which is herein referred to as a global shutter transistor drain, and the drain of the source follower transistor SF, which is herein referred to as a source follower transistor drain, are directly connected to a system power supply voltage Vdd. The system power supply voltage Vdd herein refers to the power supply voltage employed for operation of general semiconductor circuit including the image sensor pixel in a normal operation mode. The system power supply voltage Vdd is constantly applied to the global shutter transistor drain and the source follower transistor drain.

While the description of the present invention employs a power supply system in which electrical ground and a positive power supply voltage for the system power supply voltage Vdd are employed, variations of the present invention in which a negative power supply voltage and/or a power supply that is offset from the electrical ground by a constant offset are also explicitly contemplated herein. It is understood that such variations in the polarity and ground level in circuit operation are applicable to all other embodiments of the present invention as applicable as well as to the fifth embodiment.

The fifth exemplary semiconductor circuit may be employed to form an array of image sensors to capture an image. Such an array of image sensors may be employed in any optical, infrared, or ultraviolet imaging device including digital cameras. Each image sensor unit is referred to as a pixel. The operation of the array of the image sensors includes an exposure sequence and a readout sequence. The exposure sequence may be performed simultaneously employing the global shutter method. The readout sequence is performed row by row, i.e., the time for performing the readout sequence varies from row to row. Thus, the hold time between the exposure sequence and the readout sequence varies from row to row.

Initially, the global shutter control signal "gsc" turns on the global shutter transistor GS, which resets the photosensitive diode PD to a pinning voltage. The same global shutter control signal "gsc" is applied to all other global shutter transistors in an image sensor. The global shutter control signal "gsc" is then changed to turn off the global shutter transistor GS. At this step, the same global shutter control signal "gsc" is applied to all other global shutter transistors in the image sensor. All photosensitive diodes in the image sensor, including the photosensitive diode PD in FIG. 1, are exposed to impinging lights and generate charges. The electrical charges generated by the photosensitive diode PD continue to be accumulated on the node of the photosensitive diode PD tied to the global shutter transistor GS and the transfer gate transistor TG.

The charge in the floating drain node FD is reset in each image sensor pixel by setting a reset gate control signal "rgc", which is the control signal applied to the gate of the reset gate transistor RG and the reset gate transistor drain, to a high voltage, which may be substantially the same as the system power supply voltage Vdd. The same reset gate control signal "gsc" is applied to all other reset gate transistors in the image sensor. Change of the reset gate control signal "rsc" to the high voltage turns on the reset gate transistor RG, and the voltage of the floating drain node FD becomes the substantially the same as the high voltage of the reset gate control signal, which may, or may not, be substantially the same as the system power supply voltage Vdd. Preferably, the high voltage of the reset gate control signal is substantially the same as the system power supply voltage Vdd. The reset gate RG is then turned on by a change in the reset gate control signal "rgc." The same reset gate control signal "gsc" is applied to all other reset gate transistors to turn off all reset gate transistors in the image sensor. Since the floating drain node FD is floating, the voltage at the floating drain node FD remains at the same voltage before the reset gate transistor RG is turned off. The transfer gate TG is turned on by a transfer gate control signal "tgc," which ends exposure of the photosensitive diode PD and integration of electrical charges in the photosensitive diode PD. The charged collected up to that point in the photosensitive diode is transferred through the transfer gate transistor TG to the floating drain node FD. The same transfer gate control signal "tgc" is applied to all other transfer gate transistors to transfer collected charges from each photosensitive diode to a corresponding floating drain node through a transfer gate transistor. The transfer gate transistor TG and all other transfer gate transistors in the image sensor are turned by a change in the transfer gate control signal "tgc."

The sequence described above may be started again at this point while the following readout sequence is performed. Alternately, the global shutter control signal "rsc" may be set to turn off all global shutter transistors to protect against blooming of photosensitive diodes during the following readout sequence.

The readout sequence is performed row by row by selecting a row to be read out sequentially from the first row to the last row. The row select transistors in each row are controlled by a common row selection signal "rsc." Thus, there may be as many independent common row selection signals as the number of rows. Once a row is selected, all row selection transistors RS in the selected row are turned on. The shift of the voltage at a floating drain node FD from the system power supply voltage Vdd is proportional to the amount of photons that the corresponding photosensitive diode PD generates, which is proportional to the amount of light impinging on the photosensitive diode PD. The current through the data out node of each pixel is read out in each column. The amount of the current provides a first quantity related to the amount of electrical charge that the photosensitive diode PD generated.

The reset gate transistors are thereafter turned on for the selected row. This allows the readout of a second quantity, which is a background level signal for each pixel in the row. By subtracting the second quantity from the first quantity, any circuit related offset to the current measurement that generated the first quantity is compensated, i.e., any circuit specific contributions to the image data from the image sensor are eliminated.

However, there is a small amount of leakage of charge from the floating drain node FD to the substrate, through the transfer gate transistor TG, and the reset gate transistor RG since no device is perfect. In practical terms, the most significant leakage is typically the leakage through the reset gate transistor. Such a leakage alters the voltage at the floating drain node FD during the hold time between the exposure sequence and the readout sequence. The greater the leakage, the greater the shift in the voltage during the hold time, and consequently, the greater the degree of image degradation from the array of the image sensor pixels.

According to the fifth embodiment of the present invention, the low voltage is applied to the reset gate transistor drain during the hold time for each row of the array of the image sensor pixels. Compared with an alternate scenario of applying the system power supply voltage Vdd to the reset gate transistor drain, the low voltage applied to the reset gate transistor drain has the effect of decreasing the voltage bias across the reset gate transistor source and the reset gate transistor drain. This reduces the leakage current through the reset gate transistor RG during the hold time. The reduction of the leakage current through the reset gate transistor RG reduces the shift of the voltage at the floating drain node FD throughout the hold time. Thus, the voltage at the floating drain node FD during the readout sequence more closely replicates the voltage at the floating drain node FD immediately after the exposure sequence, thereby enhancing the overall fidelity of the image obtained from the array of the image sensor pixels.

During the readout sequence, the reset gate control signal "rgc" applies the low voltage to the reset gate transistor drain. The row select transistor RS is turned on by providing a high voltage, which may, or may not be, substantially the same as the system power supply voltage Vdd, to the row select control signal "rsc." The current flowing out of the row select transistor RS at the "data out" node is determined by the voltage at the source follower transistor gate, which is the voltage at the floating drain node FD. Thus, the amount of the light that impinged onto the photosensitive diode PD is translated into an electrical signal at the "data out" node, which is the source of the row select transistor RS for each of the image sensor pixel in the array.

Optionally, any offset between different pixels may be compensated for by calibrating each pixel. One method of effecting such compensation is to turn on the reset gate transistor RG after measuring the electrical signal at the "data out" node. The floating drain node FD charges to the system power supply voltage. The electrical signal is measured at the "data out" node with the row select control signal "rsc" set to the high voltage. The electrical signal thus measured is the background level signal corresponding to an unexposed state of the photosensitive diode in the corresponding pixel.

In general, the method of operating a semiconductor circuit of an array of image sensors according to the first embodiment of the present invention comprises:

exposing an entirety of the array simultaneously, while applying a first voltage, which is a high voltage applied to the reset gate control signal, to each drain of reset gate transistors in the entirety of the array;

applying a second voltage, which is a low voltage applied to the reset gate control signal, to each drain of the reset gate transistors the entirety of the array, after the exposing of the entirety of the array, wherein the second voltage is less than the first voltage so that the second voltage provides less leakage of charge per time of a floating diffusion node than the first voltage; and transferring data from the array of image sensors row by row, wherein the hold time between the exposing of the entirety of the array and the transferring is different from row to row.

Figure 6:
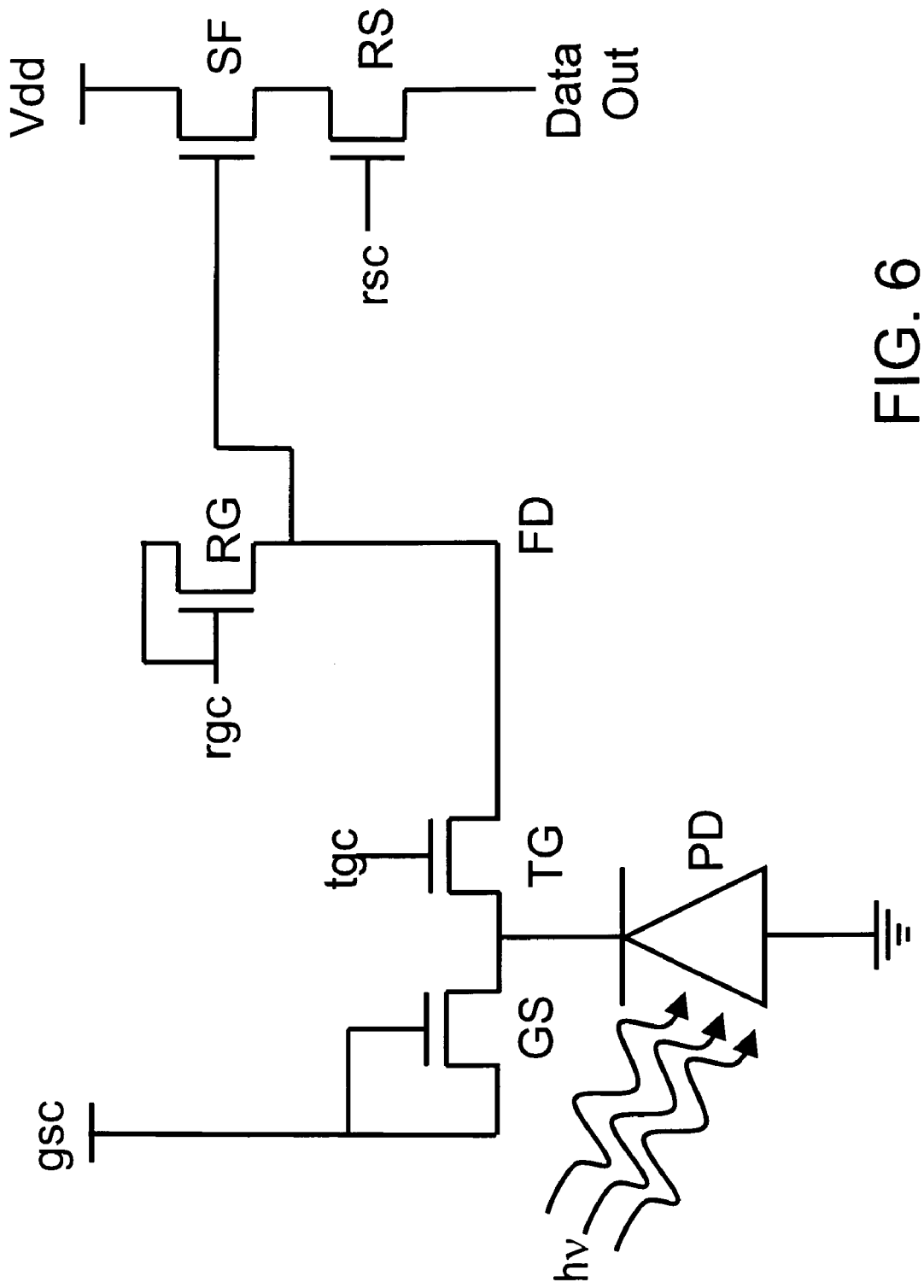

Referring to FIG. 6, a sixth exemplary semiconductor circuit comprising an image sensor pixel is shown according to a sixth embodiment of the present invention. The sixth exemplary semiconductor circuit comprises a photosensitive diode PD, a global shutter transistor GS, a transfer gate transistor TG, a reset gate transistor RG, a source follower transistor SF, and a row select transistor RS as the fifth exemplary semiconductor circuit.

According to the sixth embodiment, the drain of the reset gate transistor RG, which is herein referred to as a reset gate transistor drain, is directly connected to the gate of the reset gate transistor RG. The drain of the source follower transistor SF, which is herein referred to as a source follower transistor drain, is directly connected to a system power supply voltage Vdd. In contrast with the fifth embodiment, however, the gate of the global shutter transistor GS, which is herein referred to as a global shutter transistor gate, is connected to the drain of the global shutter transistor GS, which is herein referred to as a global shutter transistor drain, to which a global shutter control signal "gsc" is applied by a global shutter circuit (not shown).

The sixth exemplary semiconductor circuit may be employed to form an array of image sensors to capture an image in the same manner as the fifth embodiment. The exposure sequence may be performed in substantially the same manner as in the fifth embodiment except for the operation of the global shutter transistor GS. The global shutter transistor operates in the same manner as in the fourth embodiment. Specifically, the gate shutter control signal is held high only during the exposure sequence during the operation of the image sensor pixel. The voltage of the gate shutter control signal "gsc" may, or may not, be substantially the same as the system power supply voltage Vdd. During the readout sequence, the gate shutter control signal "gsc" may be held low to shut off any leakage current through the global shutter transistor GS in each image sensor pixel. As in the fifth embodiment, the hold time between the exposure sequence and the readout sequence varies from row to row.

According to the sixth embodiment of the present invention, the low voltage is applied to the reset gate transistor drain during the hold time for each row of the array of the image sensor pixels. Compared with an alternate scenario of applying the system power supply voltage Vdd to the reset gate transistor drain, the low voltage applied to the reset gate transistor drain has the effect of decreasing the voltage bias across the reset gate transistor source and the reset gate transistor drain. This reduces the leakage current through the reset gate transistor RG during the hold time. The reduction of the leakage current through the reset gate transistor RG reduces the shift of the voltage at the floating drain node FD throughout the hold time. Thus, the voltage at the floating drain node FD during the readout sequence more closely replicates the voltage at the floating drain node FD immediately after the exposure sequence, thereby enhancing the overall fidelity of the image obtained from the array of the image sensor pixels. The same readout sequence may be employed in the sixth embodiment as in the fifth embodiment.

Figure 7:
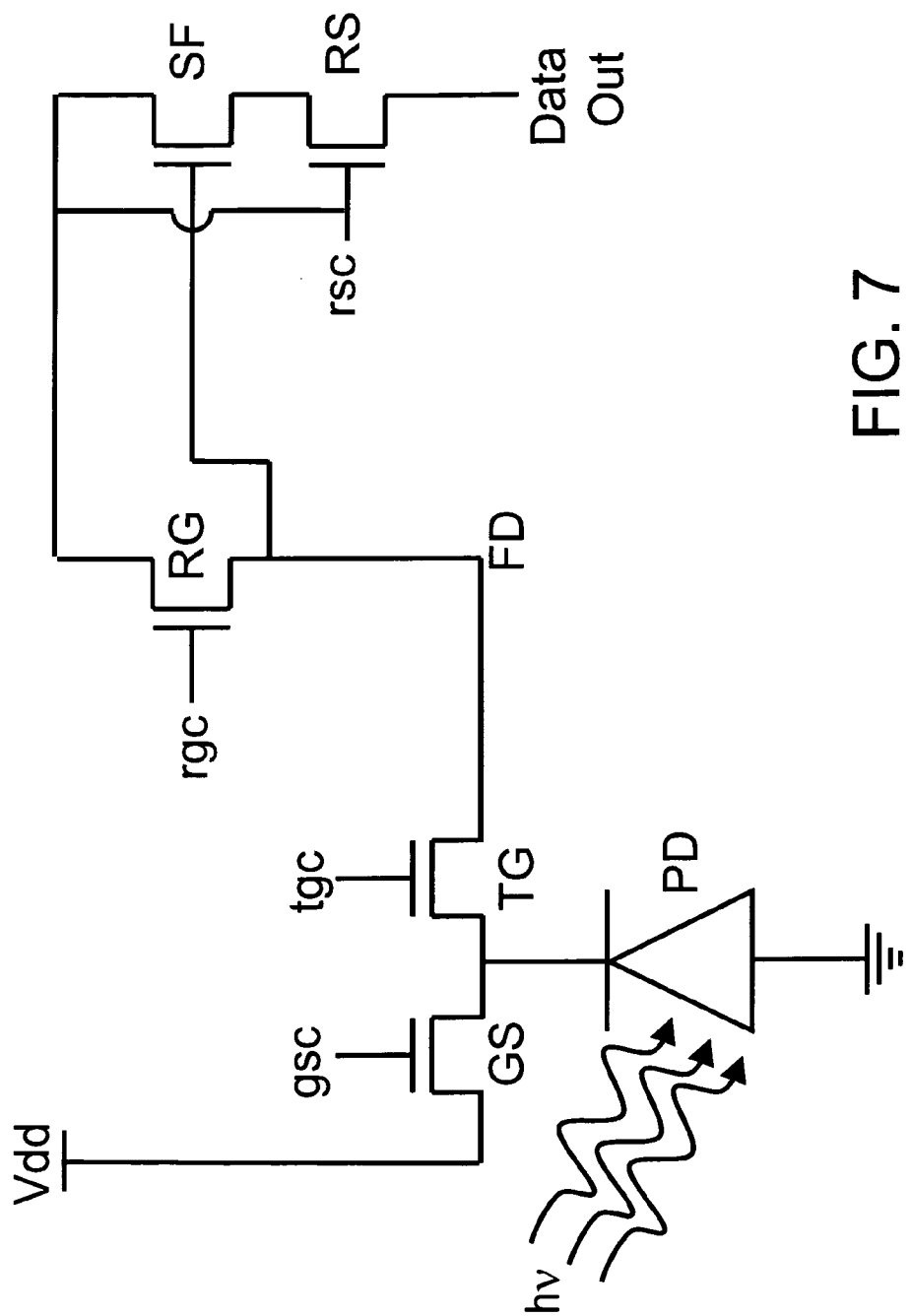

Referring to FIG. 7, a seventh exemplary semiconductor circuit comprising an image sensor pixel is shown according to a seventh embodiment of the present invention. The seventh exemplary semiconductor circuit comprises a photosensitive diode PD, a global shutter transistor GS, a transfer gate transistor TG, a reset gate transistor RG, a source follower transistor SF, and a row select transistor RS as the fifth exemplary semiconductor circuit.

According to the seventh embodiment, the drain of the global shutter transistor GS, which is herein referred to as a global shutter drain, is directly connected to a system power supply voltage Vdd. In contrast with the fifth embodiment, the drain of the reset gate transistor RG, which is herein referred to as a reset gate transistor drain, is directly connected to the gate of the row select transistor RS, which is herein referred to as a row select transistor gate, to which a row select control signal "rsc" is applied. Further, the drain of the source follower transistor, which is herein referred to as a source follower transistor drain, is directly connected to the row select transistor gate.

The seventh exemplary semiconductor circuit may be employed to form an array of image sensors to capture an image in the same manner as the fifth embodiment. The global shutter transistor GS operates in the same manner as in the fifth embodiment. As in the fifth embodiment, the hold time between the exposure sequence and the readout sequence varies from row to row.

According to the seventh embodiment of the present invention, the low voltage is applied to the reset gate transistor drain by the row select control signal "rsc" during the hold time for each row of the array of the image sensor pixels. Compared with an alternate scenario of applying the system power supply voltage Vdd to the reset gate transistor drain, the low voltage applied to the reset gate transistor drain has the effect of decreasing the voltage bias across the reset gate transistor source and the reset gate transistor drain. This reduces the leakage current through the reset gate transistor RG during the hold time. The reduction of the leakage current through the reset gate transistor RG reduces the shift of the voltage at the floating drain node FD throughout the hold time. Thus, the voltage at the floating drain node FD during the readout sequence more closely replicates the voltage at the floating drain node FD immediately after the exposure sequence, thereby enhancing the overall fidelity of the image obtained from the array of the image sensor pixels. The same readout sequence may be employed in the seventh embodiment as in the fifth embodiment.

Figure 8:
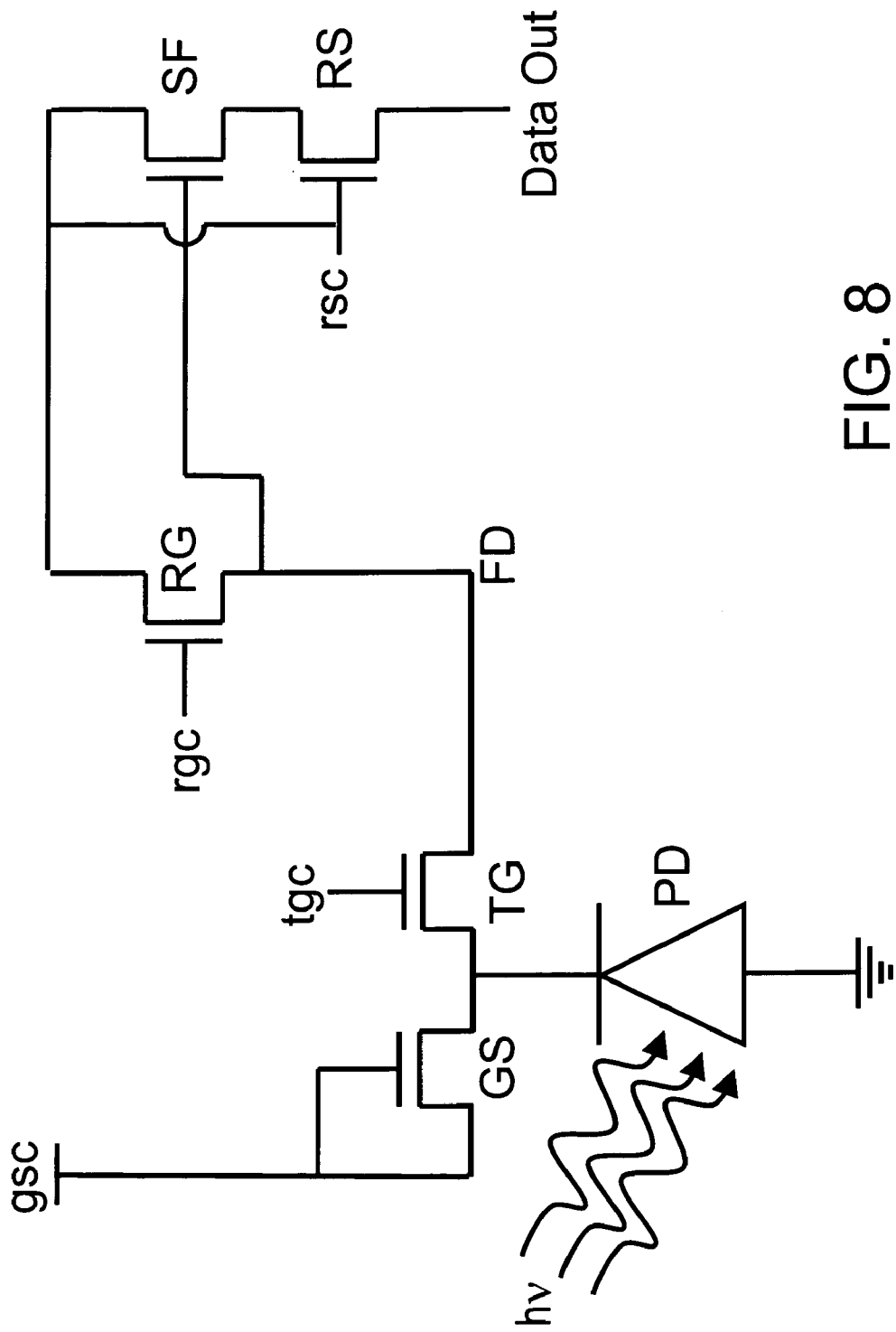

Referring to FIG. 8, an eighth exemplary semiconductor circuit comprising an image sensor pixel is shown according to an eighth embodiment of the present invention. The eighth exemplary semiconductor circuit comprises a photosensitive diode PD, a global shutter transistor GS, a transfer gate transistor TG, a reset gate transistor RG, a source follower transistor SF, and a row select transistor RS as the fifth exemplary semiconductor circuit.

According to the eighth embodiment, the drain of the reset gate transistor RG, which is herein referred to as a reset gate transistor drain, is directly connected to the gate of the reset gate transistor RG as in the seventh embodiment. The drain of the source follower transistor SF, which is herein referred to as a source follower transistor drain, is directly connected to a system power supply voltage Vdd as in the seventh embodiment. The gate of the global shutter transistor GS, which is herein referred to as a global shutter transistor gate, is connected to the drain of the global shutter transistor GS, which is herein referred to as a global shutter transistor drain, to which a global shutter control signal "gsc" is applied by a global shutter circuit (not shown) as in the sixth embodiment.

The eighth exemplary semiconductor circuit may be employed to form an array of image sensors to capture an image in the same manner as the seventh embodiment. The exposure sequence may be performed in substantially the same manner as in the seventh embodiment except for the operation of the global shutter transistor GS. The global shutter transistor operates in the same manner as in the sixth embodiment. Specifically, the gate shutter control signal is held high only during the exposure sequence during the operation of the image sensor pixel. The voltage of the gate shutter control signal "gsc" may, or may not, be substantially the same as the system power supply voltage Vdd. During the readout sequence, the gate shutter control signal "gsc" may be held low to shut off any leakage current through the global shutter transistor GS in each image sensor pixel. As in the seventh embodiment, the hold time between the exposure sequence and the readout sequence varies from row to row.

According to the eighth embodiment of the present invention, the low voltage is applied to the reset gate transistor drain during the hold time for each row of the array of the image sensor pixels. Compared with an alternate scenario of applying the system power supply voltage Vdd to the reset gate transistor drain, the low voltage applied to the reset gate transistor drain has the effect of decreasing the voltage bias across the reset gate transistor source and the reset gate transistor drain. This reduces the leakage current through the reset gate transistor RG during the hold time. The reduction of the leakage current through the reset gate transistor RG reduces the shift of the voltage at the floating drain node FD throughout the hold time. Thus, the voltage at the floating drain node FD during the readout sequence more closely replicates the voltage at the floating drain node FD immediately after the exposure sequence, thereby enhancing the overall fidelity of the image obtained from the array of the image sensor pixels. The same readout sequence may be employed in the sixth embodiment as in the seventh embodiment.

Figure 9:
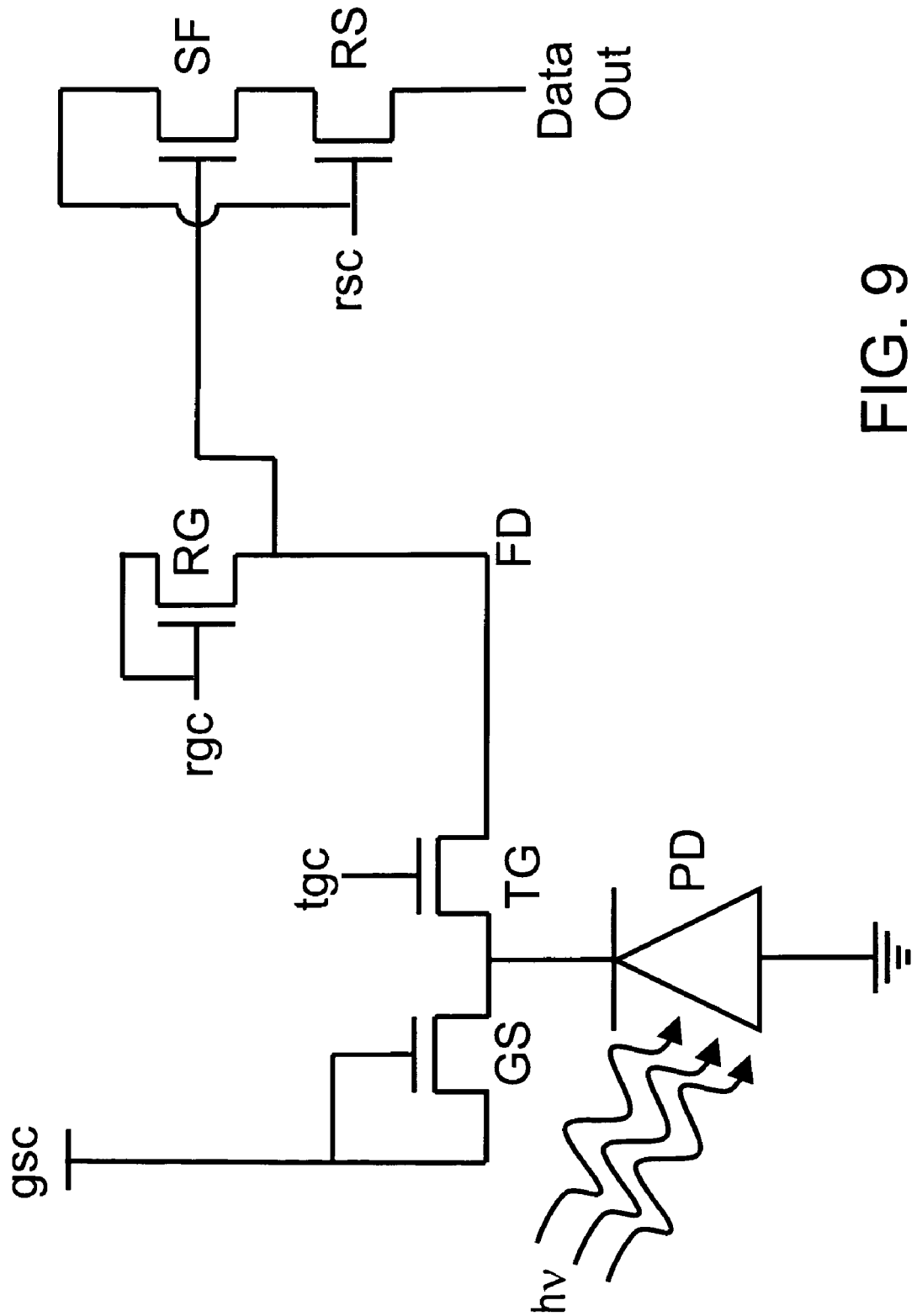

Referring to FIG. 9, a ninth exemplary semiconductor circuit comprising an image sensor pixel is shown according to a ninth embodiment of the present invention. The ninth exemplary semiconductor circuit comprises a photosensitive diode PD, a global shutter transistor GS, a transfer gate transistor TG, a reset gate transistor RG, a source follower transistor SF, and a row select transistor RS as the sixth exemplary semiconductor circuit.

According to the ninth embodiment, the drain of the reset gate transistor RG, which is herein referred to as a reset gate transistor drain, is directly connected to the gate of the reset gate transistor RG. The gate of the global shutter transistor GS, which is herein referred to as a global shutter transistor gate, is connected to the drain of the global shutter transistor GS, which is herein referred to as a global shutter transistor drain, to which a global shutter control signal "gsc" is applied by a global shutter circuit (not shown) as in the sixth embodiment. In contrast with the sixth embodiment, however, the drain of the source follower transistor SF, which is herein referred to as a source follower transistor drain, is directly connected to the gate of the row select transistor, which is herein referred to as a row select transistor gate, to which a row selection control signal "rsc" is applied.

The ninth exemplary semiconductor circuit may be employed to form an array of image sensors to capture an image in the same manner as the sixth embodiment. The exposure sequence may be performed in substantially the same manner as in the sixth embodiment. The global shutter transistor operates in the same manner as in the fourth embodiment. Specifically, the gate shutter control signal is held high only during the exposure sequence during the operation of the image sensor pixel. The voltage of the gate shutter control signal "gsc" may, or may not, be substantially the same as the system power supply voltage Vdd. During the readout sequence, the gate shutter control signal "gsc" may be held low to shut off any leakage current through the global shutter transistor GS in each image sensor pixel. As in the sixth embodiment, the hold time between the exposure sequence and the readout sequence varies from row to row.

The ninth exemplary semiconductor circuit enables application of an optimized voltage to the source follower transistor drain through the row selection control signal "rsc." While the leakage current through the source follower transistor SF is minimal, the optimized voltage of the row selection control signal "rsc" further reduces any leakage current associated with the source follower transistor SF. Further, the row selection control signal "rsc" may be optimized to reduce power consumption during the hold time.

According to the ninth embodiment of the present invention, the low voltage, which may be substantially the same as electrical ground, is applied to the reset gate transistor drain during the hold time for each row of the array of the image sensor pixels. Compared with an alternate scenario of applying the system power supply voltage Vdd to the reset gate transistor drain, the low voltage applied to the reset gate transistor drain has the effect of decreasing the voltage bias across the reset gate transistor source and the reset gate transistor drain. This reduces the leakage current through the reset gate transistor RG during the hold time. The reduction of the leakage current through the reset gate transistor RG reduces the shift of the voltage at the floating drain node FD throughout the hold time. Thus, the voltage at the floating drain node FD during the readout sequence more closely replicates the voltage at the floating drain node FD immediately after the exposure sequence, thereby enhancing the overall fidelity of the image obtained from the array of the image sensor pixels. The same readout sequence may be employed in the ninth embodiment as in the sixth embodiment.

Figure 10:
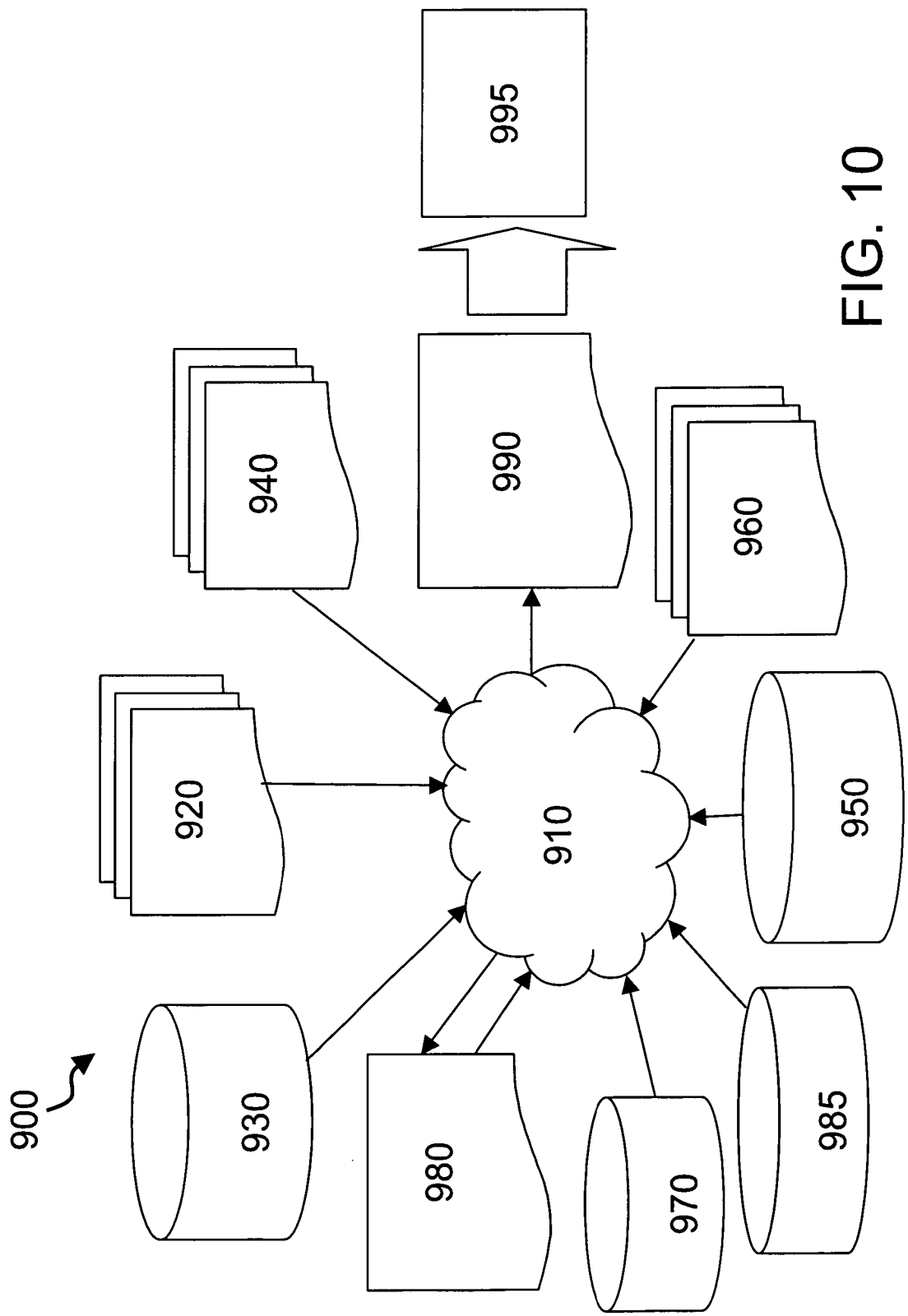
FIG. 10 is a flow diagram of a design process used in semiconductor design and manufacture of the semiconductor circuits according to the present invention.

FIG. 10 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in any of FIGS. 1-9 in the form of schematics or hardware description language (HDL; e.g. Verilog, VHDL, C, etc.) The design structure 920 may be contained on one or more machine readable medium. For example, design structure 920 may be a text file or a graphical representation of an embodiment of the invention as shown in FIGS. 1-9.

For example, the design structure may comprise:

a first data representing a photosensitive diode PD of FIGS. 1-9;

a second data representing a first transistor, which is a global shutter transistor GS of FIGS. 1-9, including a first transistor source, which is a global shutter transistor source, directly connected to the photosensitive diode;

a third data representing a second transistor, which is a transfer gate transistor TG of FIGS. 1-9, including a second transistor source, which is a transfer gate transistor source, directly connected to the photodiode and a second transistor drain, which is a transfer gate transistor drain, constituting a floating diffusion node;

a fourth data representing a third transistor, which is a reset gate transistor RG of FIGS. 1-9, including a third transistor source, which is a reset gate transistor source, directly connected to the floating diffusion node and a third transistor drain, which is a reset gate transistor drain, connected to circuit configured to dynamically apply a first voltage and a second voltage, wherein the first voltage is different from the second voltage, and wherein the second voltage provides less leakage of charge per time from the floating diffusion node than the first voltage;

a fifth data representing a switchable voltage supply circuit configured to dynamically provide the first voltage or the second voltage to the third transistor drain, and the first voltage is a system power supply voltage;

a sixth data representing a fourth transistor, which is a source follower transistor SF of FIGS. 1-9, including a fourth transistor source, which is a source follower transistor source, and a fourth transistor gate, which is a source follower transistor gate, wherein the fourth transistor gate is directly connected to the floating diffusion node; and a seventh data representing a fifth transistor, which is a row select transistor RS of FIGS. 1-9, including a fifth transistor drain, which is a row select transistor drain, and a fifth transistor source, which is a row select transistor source, wherein the fifth transistor drain is directly connected to the fourth transistor source and the fifth transistor source is configured to provide an output signal of an image sensor pixel.

The first voltage and the second voltage may be provided a switchable voltage supply circuit, which may be represented by an eighth data, that dynamically provides a system power supply voltage and an alternate voltage lower than said system power supply voltage. Alternately, the first voltage and the second voltage may be provided by a control signal, such as a reset gate control signal "rgc" or a row select control signal "rsc," configured to be set at two different voltages and directly applied to a data representing at least one transistor.

Design process 910 preferably synthesizes (or translates) an embodiment of the invention as show in FIGS. 1-9 into a netlist 980, wherenetlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIG. 2, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 1-9. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor circuit for an image sensor pixel, said semiconductor circuit comprising:
    a photosensitive diode;
    a first transistor including a first transistor source directly connected to said photosensitive diode;
    a second transistor including a second transistor source directly connected to said photodiode and a second transistor drain constituting a floating diffusion node;
    a third transistor including a third transistor source directly connected to said floating diffusion node; and
    a switchable voltage supply circuit having a node directly connected to a third transistor drain, wherein said switchable voltage supply circuit dynamically provides at least two different voltages to said node.

2. The semiconductor circuit of claim 1, wherein said at least two different voltages include a system power supply voltage and an alternate voltage lower than said system power supply voltage.

3. The semiconductor circuit of claim 2, further comprising:
    a fourth transistor including a fourth transistor source and a fourth transistor gate, wherein said fourth transistor gate is directly connected to said floating diffusion node; and
    a fifth transistor including a fifth transistor drain and a fifth transistor source, wherein said fifth transistor drain is directly connected to said fourth transistor source and said fifth transistor source is configured to provide an output signal of said image sensor pixel.

4. The semiconductor circuit of claim 3, wherein said fourth transistor includes a fourth transistor drain that is directly connected to said switchable voltage supply circuit.

5. The semiconductor circuit of claim 3, wherein said fourth transistor includes a fourth transistor drain that is directly connected to said system power supply voltage and is not resistively connected to said switchable voltage supply circuit.

6. The semiconductor circuit of claim 3, wherein said first transistor further includes a first transistor drain directly connected to said system power supply voltage and a first transistor gate not resistively connected to said system power supply voltage.

7. The semiconductor circuit of claim 3, wherein said first transistor further includes a first transistor drain and a first transistor gate, wherein said first transistor drain and said first transistor gate are directly connected and configured to receive a common control signal.

8. A semiconductor circuit for an image sensor pixel, said semiconductor circuit comprising:
    a photosensitive diode;
    a first transistor including a first transistor source directly connected to said photosensitive diode;
    a second transistor including a second transistor source directly connected to said photodiode and a second transistor drain constituting a floating diffusion node;
    a third transistor including a third transistor source directly connected to said floating diffusion node and a third transistor drain connected to a control signal configured to be set at two different voltages; and
    an electrical connection between said third transistor drain and a gate of at least one transistor of said image sensor pixel, wherein said electrical connection applies said control signal directly and simultaneously to said gate of said at least one transistor of said image sensor pixel and said third transistor drain.

9. The semiconductor circuit of claim 8, wherein said control signal is directly connected to a gate of said third transistor and said third transistor drain.

10. The semiconductor circuit of claim 9, wherein said first transistor further includes a first transistor drain and a first transistor gate, wherein said first transistor drain and said first transistor gate are directly connected and configured to receive a common global shutter control signal that is electrically isolated from said control signal.

11. The semiconductor circuit of claim 8, further comprising:
    a fourth transistor including a fourth transistor source and a fourth transistor gate, wherein said fourth transistor gate is directly connected to said floating diffusion node; and
    a fifth transistor including a fifth transistor drain and a fifth transistor source, wherein said fifth transistor drain is directly connected to said fourth transistor source and said fifth transistor source is configured to provide an output signal of said image sensor pixel.

12. The semiconductor circuit of claim 11, wherein said fourth transistor further comprises a fourth transistor drain directly connected to a system power supply voltage.

13. The semiconductor circuit of claim 11, wherein said fourth transistor further comprises a fourth transistor drain and said fifth transistor further comprises a fifth transistor gate, and wherein said fourth transistor drain is directly connected to said fifth transistor gate.

14. The semiconductor circuit of claim 11, wherein said control signal is directly connected to said fifth transistor gate.

* * * * *